(12) United States Patent
Takeuchi et al.

(10) Patent No.: US 6,252,387 B1
(45) Date of Patent: Jun. 26, 2001

(54) OSCILLOSCOPE UTILIZING PROBE WITH ELECTRO-OPTIC CRYSTAL

(75) Inventors: Nobuaki Takeuchi; Yoshiki Yanagisawa; Jun Kikuchi; Yoshio Endou; Mitsuru Shinagawa; Tadao Nagatsuma; Kazuyoshi Matsuhiro, all of Tokyo (JP)

(73) Assignees: Ando Electric Co., Ltd; Nippon Telegraph and Telephone Corp., both of Tokyo (JP)

( * ) Notice: Subject to any disclaimer, the term of this patent is extended or adjusted under 35 U.S.C. 154(b) by 0 days.

(21) Appl. No.: 09/167,234

(22) Filed: Oct. 6, 1998

(30) Foreign Application Priority Data

Oct. 6, 1997 (JP) ..................................................... 9-273157

(51) Int. Cl.$^7$ .............................. G02F 1/03; G04F 13/02; G01R 13/34
(52) U.S. Cl. ......................... 324/96; 324/121 R; 324/753
(58) Field of Search ................................. 324/96, 121 R, 324/753; 359/245; 356/72

(56) References Cited

FOREIGN PATENT DOCUMENTS 0 197 196    10/1986 (EP) .

OTHER PUBLICATIONS

"A High–Impedance Probe Based on Electro–Optic Sampling" Proceeding of the 15th Meeting on Lightwave Technology, May 1995, pp. 123–129.

"A Novel High–Impedance Probe For Multi–Gigahertz Signal Measurement"; Mitsuru Shinagawa et al.; IEEE Transactions On Instrumentation and Measurement; vol. 45, No. 2, Apr. 1, 1996.

*Primary Examiner*—Walter E. Snow
(74) *Attorney, Agent, or Firm*—Darby & Darby

(57) ABSTRACT

The present invention relates to an electro-optic sampling oscilloscope in which an electric field generated by a signal to be measured is coupled with an electro-optic crystal, and an optical pulse outputted from an optical pulse output circuit is caused to enter the electro-optic crystal, and the waveform of the signal to be measured is observed using the polarization state of the optical pulse. The optical pulse output circuit has as the input light thereof a sample optical pulse amplified by an optical amplifier circuit, and outputs, as an optical pulse, the output from an optical filter which blocks the propagation of the spontaneously emitted light of the optical amplifier circuit.

17 Claims, 7 Drawing Sheets

OSCILLOSCOPE UTILIZING PROBE WITH ELECTRO-OPTIC CRYSTAL

BACKGROUND OF THE INVENTION

1. Field of the Invention

The present invention relates to an electro-optic sampling oscilloscope, in which an electric field generated by a signal to be measured is coupled to an electro-optic crystal, an optical pulse is caused to enter this electro-optic crystal, and the waveform of the signal to be measured is observed by means of the polarization state of the optical pulse. In particular, the present invention relates to an electro-optic sampling oscilloscope that is provided with characteristic features in the generation of the optical pulse.

This application is based on patent application No.Hei 9-273157 filed in Japan, the content of which is incorporated herein by reference.

2. Background Art

It is possible to observe the waveform of a signal to be measured by coupling the electric field generated by the signals to be measured to an electro-optic crystal, causing laser light to enter this electro-optic crystal, and using the polarization state of the laser light. Here, it is possible to use this laser light in pulse form, and to conduct measurement with extremely high time resolution when the sampling of the signal to be measured is conducted. An electro-optic sampling oscilloscope employs an electro-optic probe which takes advantage of this phenomenon.

In comparison with conventional sampling oscilloscopes which employ electrical probes, such an electro-optic sampling oscilloscope (herein below termed an "EOS" oscilloscope) has the following characteristic features:

(1) When signals are measured, a ground wire is not required, so that measurement is simplified.
(2) The metal pin which is at the lead end of the electro-optic probe is isolated from the circuit system, so that it is possible to realize a high input impedance, and as a result, the state at the point at which measurement is conducted is essentially free of fluctuations.
(3) Since optical pulses are employed, measurement is possible in a broad band up to the order of GHz.

FIG. 5 serves to explain the measurement concept of the electro-optic probe in an EOS oscilloscope.

As shown in FIG. 5, a metal pin 21 is provided at the lead end of the electro-optic probe, and by placing this in contact with the signal line 31 which is the subject of measurement, an electric field 23 is generated based on the measured signal. In order to couple the electric field generated with an electro-optic crystal 22, the electro-optic crystal 22 is provided at the end of the metal pin 21. With respect to this electro-optic crystal 22, as a result of the Pockels effect, which is a primary electro-optical effect, the index of refraction of the electro-optic crystal changes in accordance with the coupled electric field strength, so that when an optical pulse 25 is inputted in this state, the polarization state of the optical pulse changes. The optical pulse 25 which experiences a change in polarization is reflected by reflection mirror 24, which is a multi-layered dielectric film mirror, and is guided to the light receiver 26, which serves as the input part of the polarization detecting optical system within the electro-optic probe (Shinagawa, et al: ""A High-Impedance Probe Based on Electo-Optic Sampling," Proceeding of the 15$^{th}$ Meeting on Lightwave Sensing Technology, May 1995, pp 123–129).

Next, the structure of the EOS oscilloscope will be explained using FIG. 6.

The EOS oscilloscope comprises an EOS oscilloscope main body 1 and an electro-optic probe 2. The optical pulse 25 explained in the discussion of FIG. 5 is generated in the optical pulse output circuit 4 on the basis of the trigger signal from a trigger circuit 3, and is supplied to the electro-optic probe 2. Additionally, once the optical pulse has experienced a change in polarization, the detection of the polarization thereof and the like are conducted by the polarization detecting optical system (not depicted in the figure) within the electro-optic probe 2, and the signal thereof is inputted into the EOS oscilloscope main body 1. Additionally, the amplification and A/D conversion of the signal are conducted by A/D circuit 5, and processing in order to display the signal which is the subject of measurement, and the like, is conducted by processing circuit 6.

FIG. 7 shows the details of the optical pulse output circuit 4 in FIG. 6. From FIG. 6, first, timing circuit 31 generates a timing signal, which is the optical pulse generating timing, based on the trigger signal from trigger circuit 3. Next, optical pulse generating circuit 32 generates a sample optical pulse based on the timing signal of timing circuit 31. Since the amount of light is insufficient with this sample optical pulse, the sample optical pulse is optically amplified by optical amplifier circuit 33, and the output of this optical amplifier circuit 33 is supplied to electro-optic probe 2 as an optical pulse.

When the sample optical pulse from the optical pulse generating circuit 32 is amplified by the optical amplifier circuit 33, ASE (Amplified Spontaneous Emitting), which is amplified spontaneously emitted light which is unnecessary and does not contribute to sampling in the spectrum or to sampling along the time axis, is generated.

FIG. 8 shows an example of the spectral analysis of output from the optical amplifier circuit 33 in the optical pulse output circuit 4 shown in FIG. 7. A sample optical pulse is outputted from the optical pulse generating circuit 32 which has essentially a single frequency, and light having other frequencies, which constitutes noise, is at a sufficiently low level that it can be ignored; however, light which is unnecessary and does not contribute to the sampling in the spectra is generated by optical amplifier circuit 33, so that light having frequencies other than the frequency outputted by the optical pulse generating circuit 32 is also outputted, and reaches a level at which it can not be ignored.

Furthermore, FIG. 9 shows an example of output from the optical amplifier circuit 33 with respect to time. It can be seen from FIG. 9 that, by means of optical amplifier circuit 33, light is also outputted by optical pulse generating circuit 32 at times other than those during which the sample optical pulse is generated, so that unnecessary light which does not contribute to the sampling along the time axis is produced.

In this way, while optical amplifier circuit 33 is necessary on the one hand in order to output an optical pulse having a sufficient amount of light, this contains unnecessary light which does not contribute to the sampling in the spectrum, and light is emitted by the optical pulse generating circuit 32 at times other than those during which the sample optical pulse is generated, so that as a result of such noise, the measurement accuracy of the EOS greatly decreases.

SUMMARY OF THE INVENTION

The present invention was created in light of the above circumstances; it has as an object thereof to provide an electro-optic sampling oscilloscope which is capable of achieving a reduction in noise in the output optical pulse, and as a result, is capable of an increase in measurement accuracy.

Therefore, the present invention provides an electro-optic sampling oscilloscope in which an electric field generated by a signal to be measured is coupled with an electro-optic crystal, and an optical pulse outputted from an optical pulse output circuit is caused to enter the electro-optic crystal, and the waveform of the signal to be measured is observed using the polarization state of the optical pulse. And the optical pulse output circuit has as the input light thereof a sample optical pulse amplified by an optical amplifier circuit, and outputs, as an optical pulse, the output from an optical filter which blocks the propagation of the spontaneously emitted light of the optical amplifier circuit.

By means of this, it is possible to reduce the unnecessary light which does not contribute to the sampling in the spectra, and as a result, it is possible to produce an electro-optic sampling oscilloscope which is capable of increasing the accuracy of measurement.

Furthermore, the invention provides an electro-optic sampling oscilloscope, in which an electric field generated by a signal to be measured is coupled with an electro-optic crystal, an optical pulse outputted from an optical pulse output circuit is caused to enter into the electro-optic crystal, and the waveform of the signal to be measured is observed using the polarization state of the optical pulse. And the optical pulse output circuit controls the ON and OFF state of the sample optical pulse which was amplified by the optical amplifier circuit, and conducts the output of the optical pulse, using an optical switch synchronized with the sample optical pulse, by causing the optical switch to conduct light when the sample optical pulse is being generated, and cutting off the optical switch when the sample optical pulse is not being generated.

By means of this, it is possible to reduce the unnecessary light which does not contribute to the spectrum along the time axis, and it is possible to produce an electro-optic sampling oscilloscope which is capable of increasing the measurement accuracy.

Furthermore, the invention provides an electro-optic sampling oscilloscope, in which an electric field generated by a signal to be measured is coupled with an electro-optic crystal, an optical pulse outputted from an optical pulse output circuit is caused to enter into the electro-optic crystal, and the waveform of the signal to be measured is observed using the polarization state of the optical pulse. And the optical pulse output circuit is provided with: an optical filter which serves to block the propagation of spontaneously emitted light with respect to a sample optical pulse amplified by an optical amplifier circuit; and an optical switch which is synchronized with the sample optical pulse, and which conducts the ON and OFF state of the sample optical pulse amplified by the optical amplifier circuit by transmitting light when the sample optical pulse is being generated, and cutting off light when the sample optical pulse is not being generated. And the optical pulse output circuit outputs the amplified sample optical pulse, which is passed through the optical filter and the optical switch, as an optical pulse.

By means of this, it is possible to reduce the unnecessary light which does not contribute to the sampling in the spectra, and to reduce the unnecessary light which does not contribute to the sampling along the time axis, and as a result, it is possible to produce an electro-optic sampling oscilloscope which is capable of increasing the measurement accuracy.

This summary of the invention dose not necessarily describes all necessary features so that the invention may also be a sub-combination of these described features.

The reference symbols used in the claims are not any influences for the interpretation of the claims. (only for EP application)

DETAILED DESCRIPTION OF THE PREFERRED EMBODIMENTS

The following embodiments do not restrict the interpretation of the claims relating to the present invention, and the combination of all the features explained in the embodiments is always not being indispensable means of solving the problem.

Herein below, an EOS oscilloscope, which constitutes an embodiment of the present invention, will be explained with reference to the diagrams.

[First Embodiment]

Figure 6:
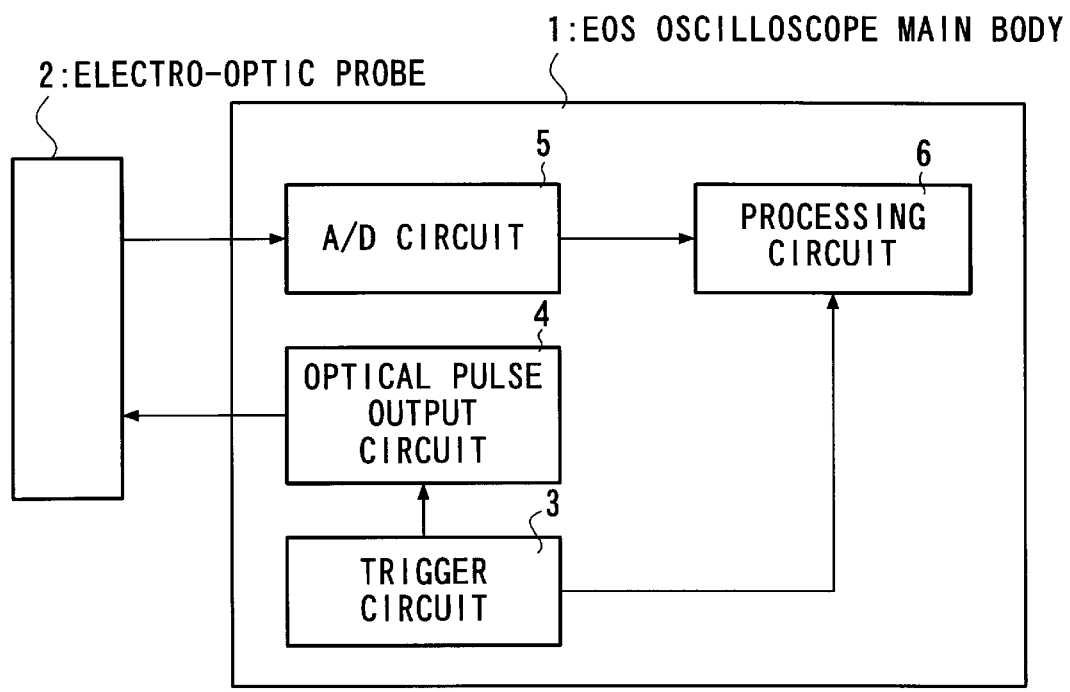
FIG. 6 is a diagram showing an example of the structure of an EOS oscilloscope.
Figure 7:
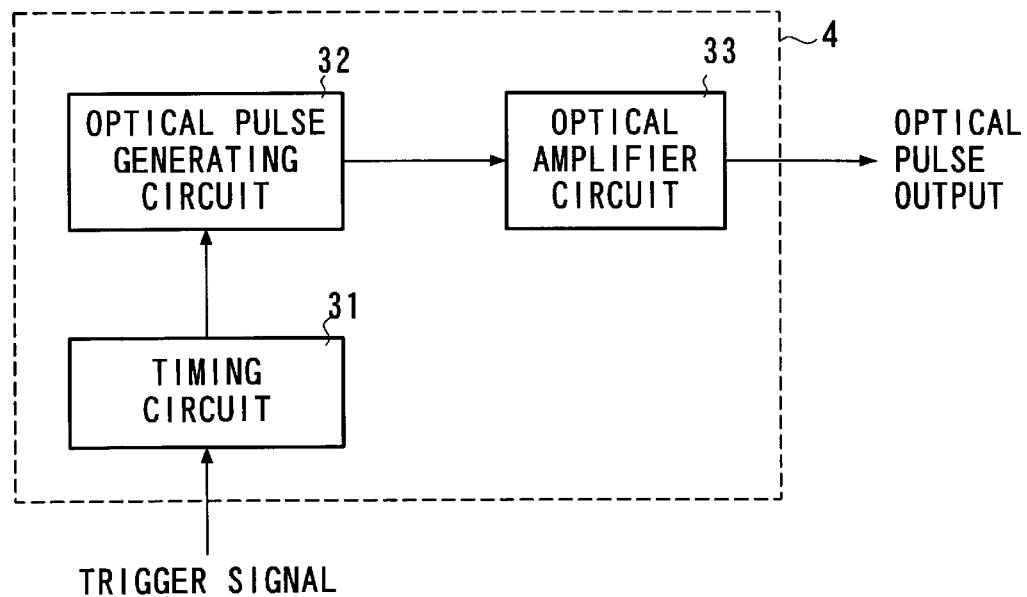
FIG. 7 is a diagram showing an example of the structure of a conventional example of an optical pulse output circuit of an EOS oscilloscope.

FIG. 6 shows an example of the structure of the EOS oscilloscope. As described above, the EOS oscilloscope comprises an EOS oscilloscope main body 1 and an electro-optic probe 2. An optical pulse supplied to the electro-optic probe 2 is generated by the optical pulse output circuit 4 on the basis of a trigger signal from a trigger circuit 3. Additionally, once the optical pulse has experienced a change in polarization, the polarization detection and the like thereof are conducted by a polarization detecting optical system (not depicted in the figure) within electro-optic probe 2, and the signal thereof is inputted into EOS oscilloscope main body 1. Additionally, the amplification and A/D conversion of the signal are conducted by A/D circuit 5, and processing for the display and the like of the signal which is the subject of measurement is conducted by processing circuit 6.

The characteristic feature of the EOS oscilloscope of the present invention lies in the optical pulse output circuit 4 shown in FIG. 6; the structure of this circuit will be explained with reference to the figures.

Figure 1:
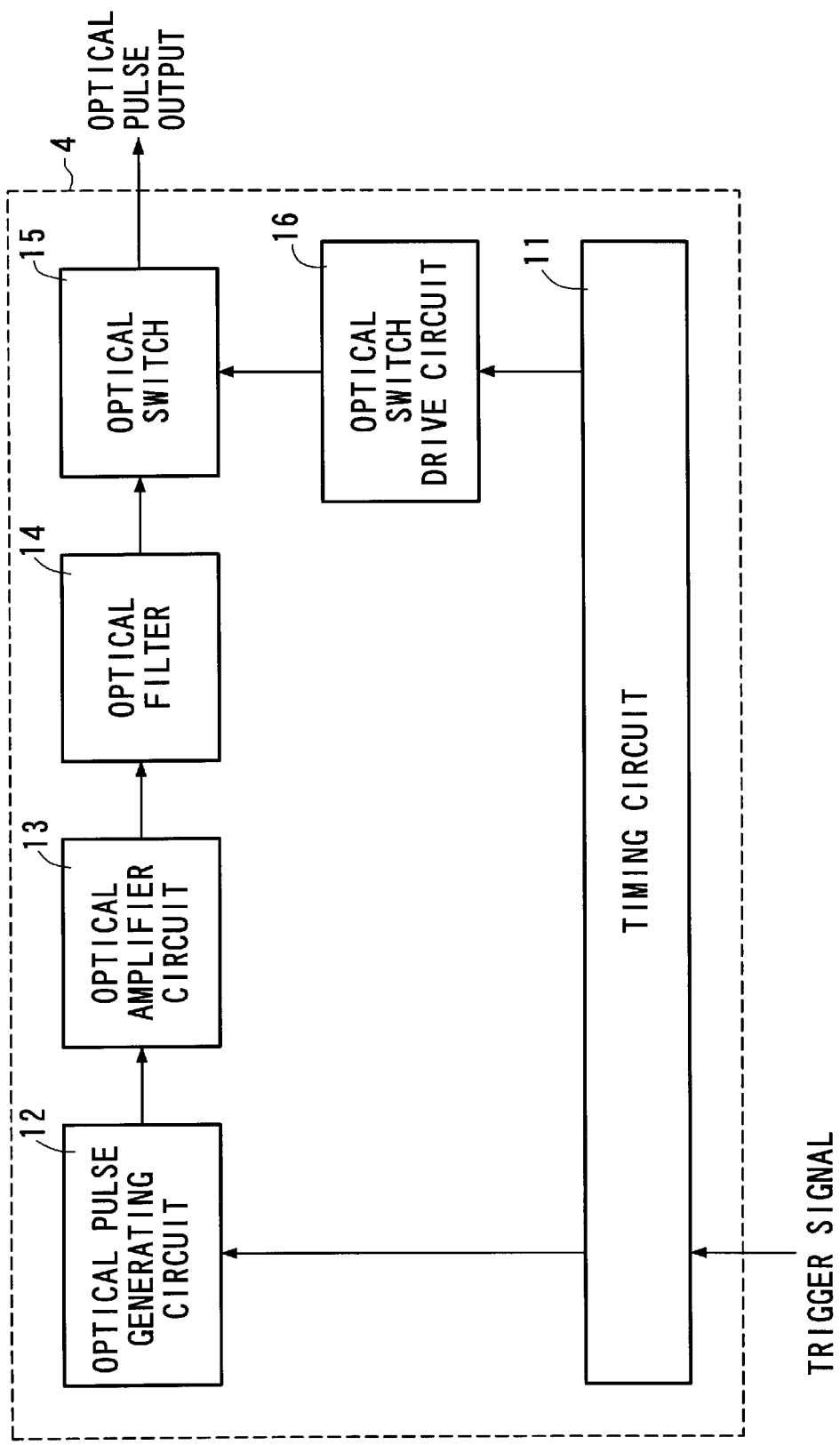
FIG. 1 is a diagram showing the structure of the optical pulse output circuit in an EOS oscilloscope in accordance with an embodiment of the present invention.

FIG. 1 shows the structure of the optical pulse output circuit 4 of an EOS oscilloscope in accordance with an embodiment of the present invention.

From FIG. 1, optical pulse output circuit 4 comprises: a timing circuit 11, which generates a timing signal which serves as the optical pulse generating timing based on the trigger signal; an optical pulse generating circuit 12, which conducts the generation of a sample optical pulse from the timing signal of timing signal 11; an optical amplifier circuit 13, which conducts the optical amplification of the sample optical pulse generated by optical pulse generating circuit 12; an optical filter 14, which blocks the propagation of the spontaneously emitted light from the optical amplifier circuit 13; an optical switch 15 which conducts the ON and OFF state of the light; and an optical switch drive circuit 16, which conducts the drive and control of the ON and OFF state of the optical switch 15 based on the timing signal from timing circuit 11.

Figure 2:
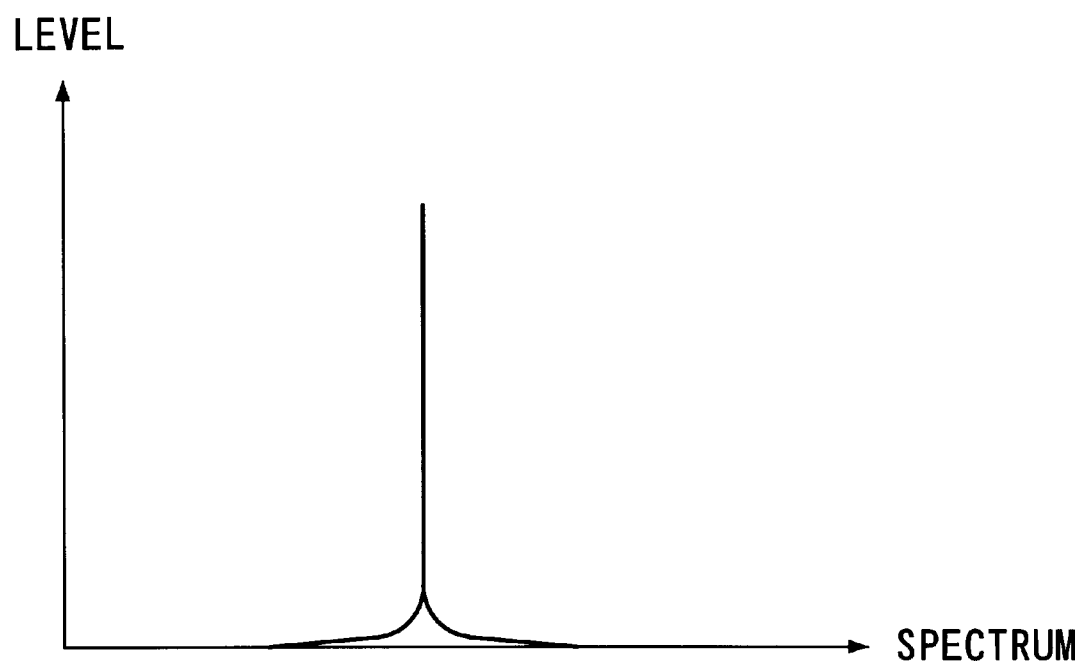
FIG. 2 is a diagram showing an example of a spectral analysis of the output of the optical filter.

Next, the operation of the optical pulse output circuit 4 of this EOS oscilloscope will be explained using FIGS. 1 through 3.

Timing circuit 11 generates a timing signal which serves as the optical pulse generating timing, based on a the trigger signal from the trigger circuit 3. This timing signal is supplied to the optical pulse generating circuit 12 and the optical switch drive circuit 16. A timing signal which serves to control the generation of the optical pulse at, for example, 30 [ps] at intervals of 250 [ns], is generated by this timing circuit 11.

The reason that the generation of the timing signal is conducted based on the trigger signal is so as to facilitate synchronization with the signal processing in the processing circuit 6 shown in FIG. 6. It is desirable that the timing signal be generated based on the trigger signal; however, this is not necessarily so limited, and generation may be conducted using other clock signals.

Optical pulse generating circuit 12 conducts the generation of a sample optical pulse using the timing signal of timing circuit 11. Here, a laser diode, for example, is employed as the optical pulse generating circuit 12, and optical pulses of a single wavelength, for example, 1.3 or 1.55 [micrometers], are generated.

Figure 5:
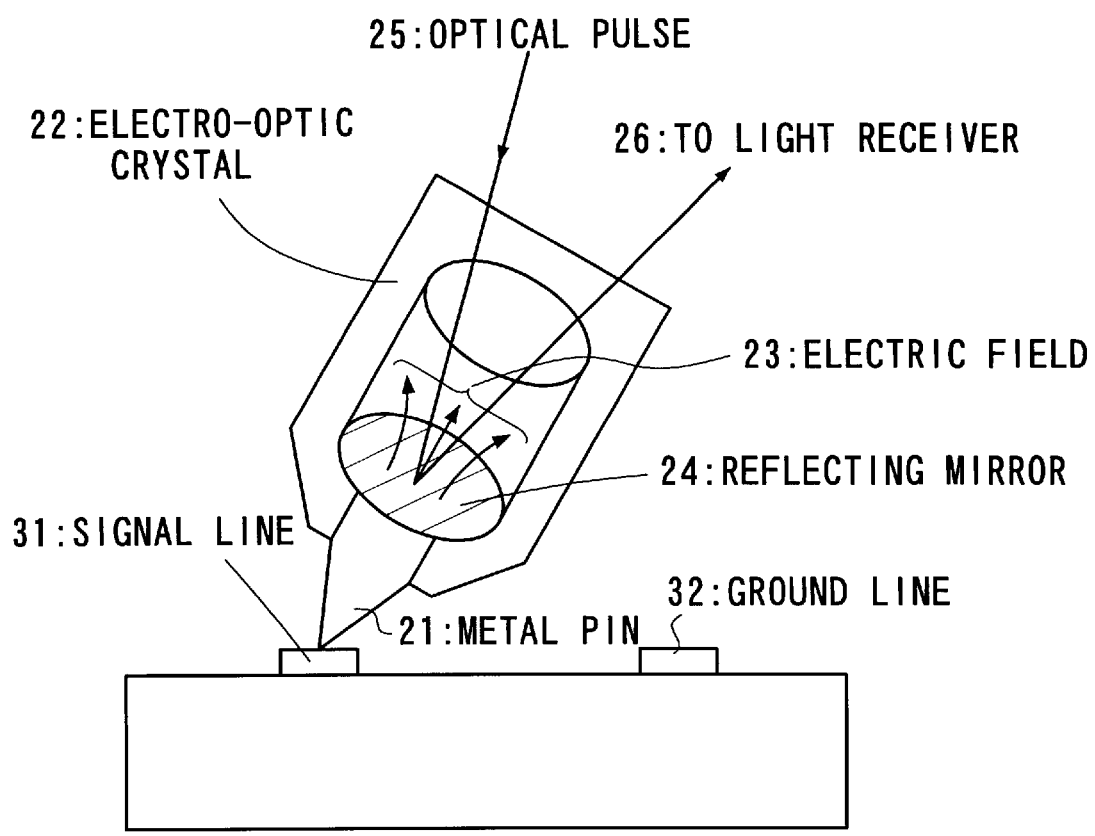
FIG. 5 is a diagram which serves to explain the measurement concept of the electro-optic probe in an EOS oscilloscope.

Here, the amount of light of the sample optical pulse generated by optical pulse generating circuit 12 is insufficient for use as the optical pulse which is inputted into the electro-optic crystal 22 shown in FIG. 5. Thus, the optical amplification of the sample optical pulse generated by optical pulse generating circuit 12 is conducted by optical amplifier circuit 13.

Figure 8:
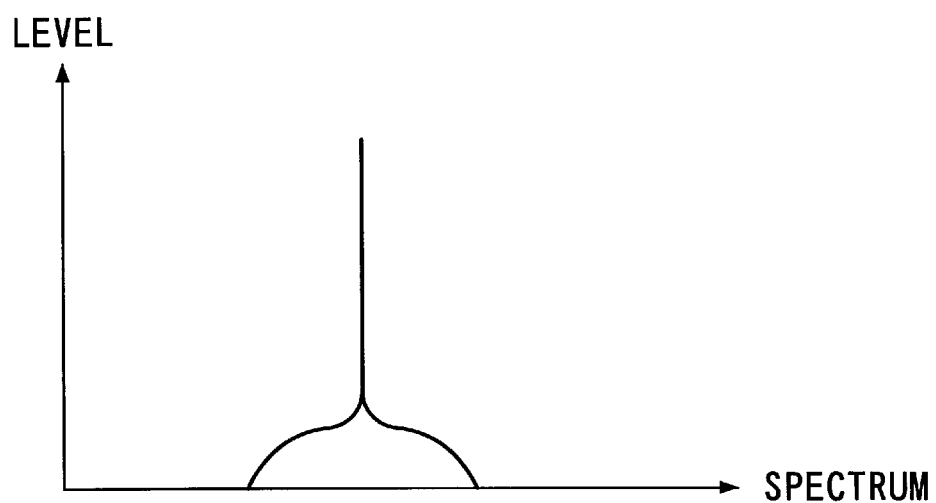
FIG. 8 is a diagram showing an example of a spectral analysis of the output of the optical amplifier circuit in FIG. 7.
Figure 9:
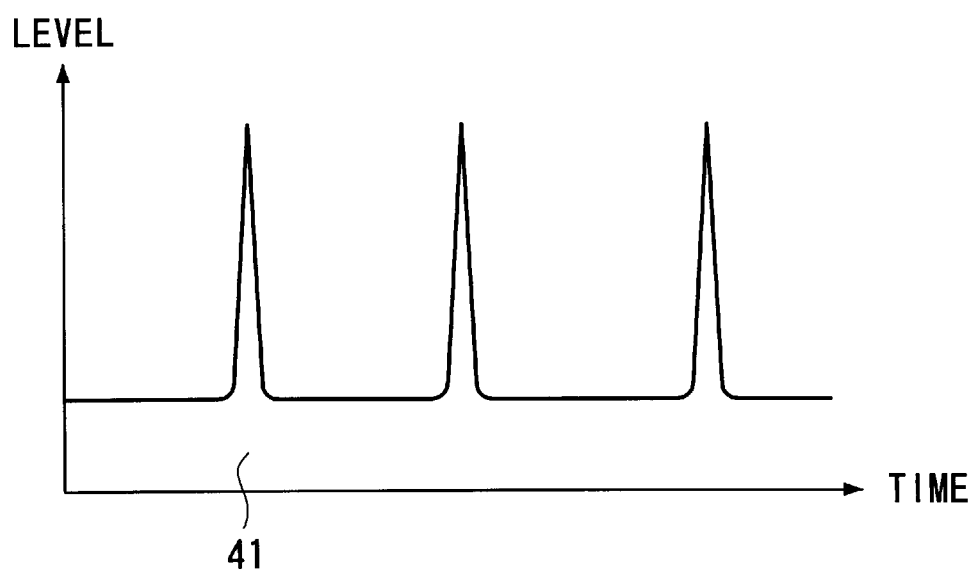
FIG. 9 is a diagram showing an example of the output over time of the optical amplifier circuit in FIG. 7.

An example of a spectral analysis of light outputted from this optical amplifier circuit 13 is shown in FIG. 8; frequencies other than the frequency outputted from optical pulse generating circuit 12 are also generated and constitute noise. Thus, in order to allow light having the required frequency, that is to say, the frequency of the sample optical pulse generated by optical pulse generating circuit 12, to pass, and in order to block the propagation of spontaneously emitted light from optical amplifier circuit 13, the light outputted from optical amplifier circuit 13 is inputted into optical filter 14. An example of a spectral analysis of the light outputted by optical filter 14 is shown in FIG. 2. As can be seen from a comparison with FIG. 8, by passing the light through this optical filter 14, it is possible to decrease the unnecessary light which does not contribute to the sampling in the spectra, and it is thus possible to increase measurement accuracy using this EOS oscilloscope.

Figure 3:
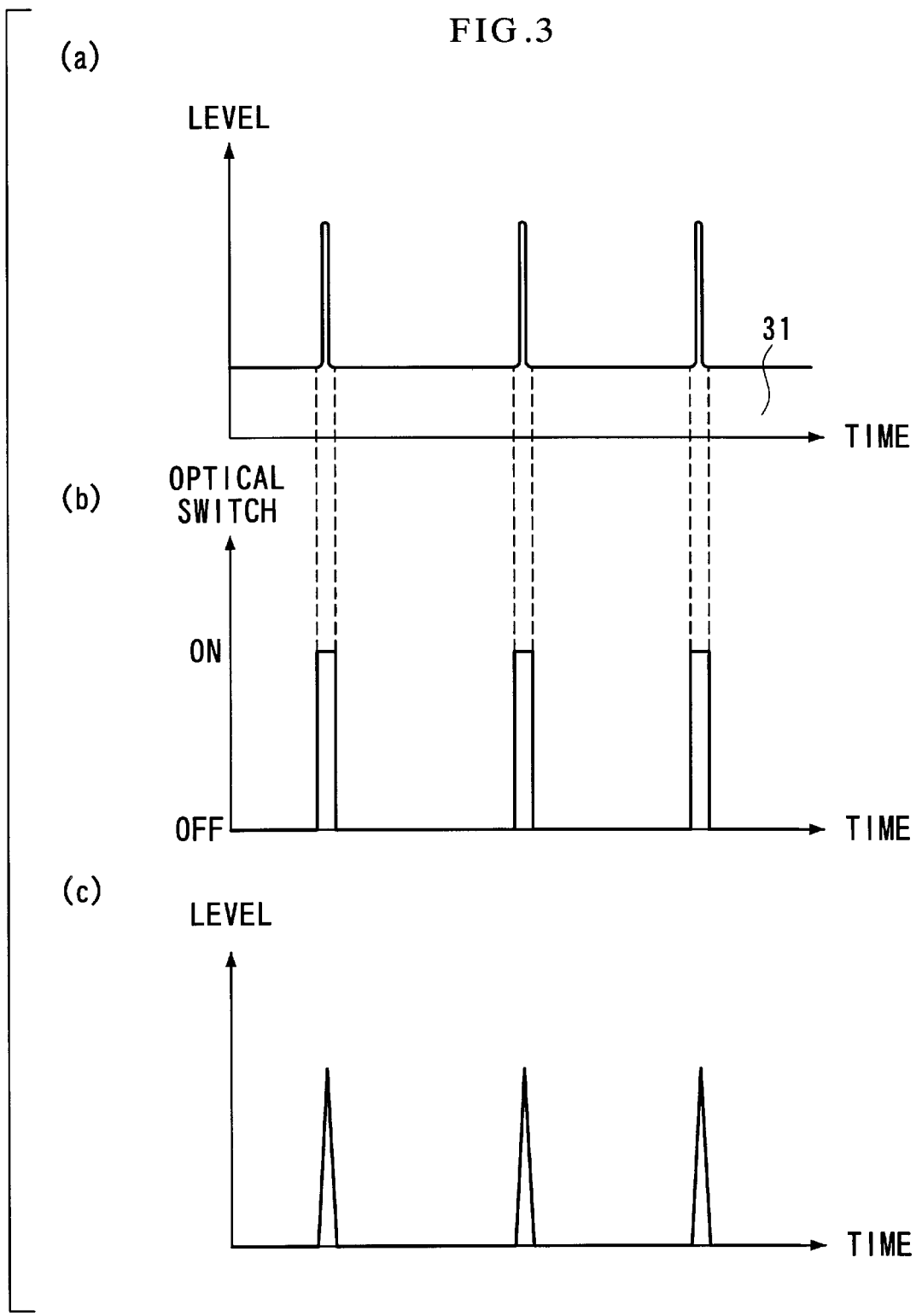
FIG. 3 is a diagram showing an example of the output of the optical filter and optical switch, and showing an example of the ON and OFF operation of the optical switch.

It is possible to exclude unnecessary light which does not contribute to the sampling in the spectra by using optical filter 14; however, as shown in part (a) in FIG. 3, it is impossible to remove unnecessary light (noise) 31, which does not contribute to the sampling along the time axis, by means of optical amplifier circuit 13. Thus, optical switch 15 and optical switch drive circuit 16 are provided, and by synchronization with the sample optical pulse, causing the optical switch 15 to transmit light when the sample optical pulse is being generated and isolating the optical switch 15 when the sample optical pulse is not being generated, the ON and OFF control is conducted, and the removal of this noise 31 is accomplished.

In other words, optical switch drive circuit 16 generates a drive signal based on the timing from timing circuit 11 which causes optical switch 15 to transmit light when the sample optical pulse is being generated by optical pulse generating circuit 12, and which isolates the optical switch 15 when the sample optical pulse is not being generated by optical pulse generating circuit 12, and supplies this drive signal to optical switch 15. Thus, as shown in part (b) in FIG. 3, optical switch 15 enters an ON or OFF state with respect to the light passing through the optical switch 15 based on the drive signal from the optical switch drive circuit 10. As a result, as shown in part (c) in FIG. 3, in the output from optical switch 15, it is possible to reduce the unnecessary light which does not contribute to the sampling along the time axis. An auditory optical switch (AO switch) or a entry wave path type optical switch (E/O switch) may be used as the optical switch 15.

In this way, by passing the output light from the optical amplifier circuit 13 through optical filter 14 and optical switch 15, it is possible to supply an optical pulse to the electro-optic probe 2 which has little unnecessary light which does not contribute to the sampling in the spectra and little unnecessary light which does not contribute to the sampling along the time axis. As a result, it is possible to create an electro-optic sampling oscilloscope having a high measurement accuracy.

[Second Embodiment]

In the embodiment described above, optical switch 15 operated with a certain delay with respect to the drive signal. For this reason, the ON and OFF operation of the optical switch was not completely synchronized with the timing signal of timing circuit 11, but rather was delayed by a certain period of time. Furthermore, the duration of time of the timing signal for optical pulse generation which was produced by timing circuit 11 was on the order of few tens of ps, so that as a result of the delay in the ON and OFF operation of optical switch 15, some unnecessary light which did not contribute to the sampling on the time axis remained in the optical pulse which was outputted by optical pulse output circuit 4.

In this second embodiment, the timing signals are sent to the optical pulse generating circuit 12 with allowance made for the delay in the ON and OFF operation of the optical switch 15.

Figure 4:
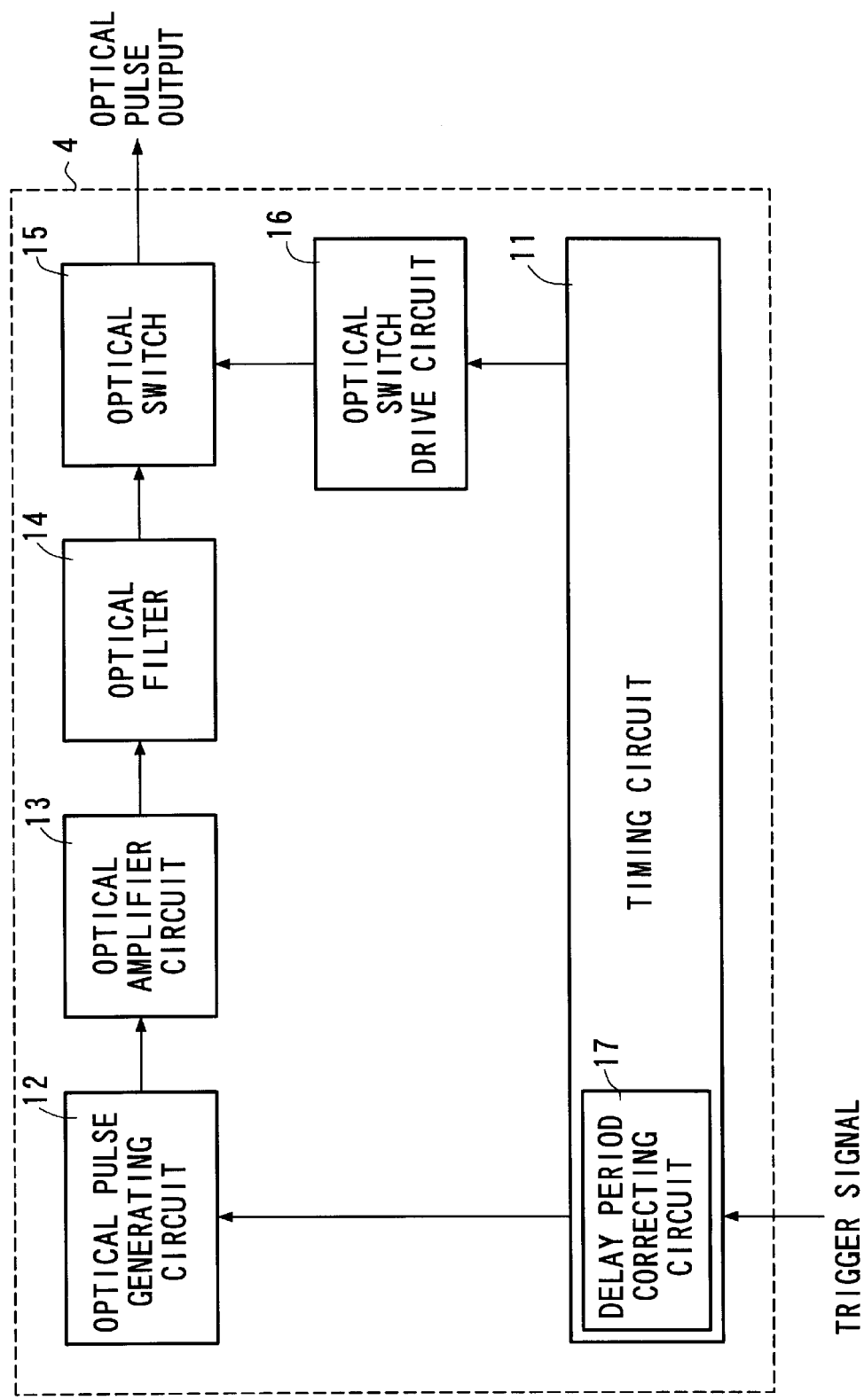
FIG. 4 is a diagram showing the structure of an optical pulse output circuit of an EOS oscilloscope in accordance with another embodiment of the present invention.

FIG. 4 shows the structure of the optical pulse output circuit 4 in an EOS oscilloscope in accordance with the second embodiment of the present invention. In the figure, parts which correspond to the parts shown in FIG. 1 are given identical reference numbers, and an explanation thereof will be omitted here.

The differences in the structure of the optical pulse output circuit 4 in FIGS. 1 and 3 are that, within the timing circuit 11 in FIG. 4, a delay period correcting circuit 17 is provided which delays the timing signal generated by timing circuit 11 by the delay period of the optical switch 14, and outputs this delayed timing signal to the optical pulse generating circuit 12.

By means of this delay period correcting circuit 17, a timing signal which is delayed by the delay period of the operation of optical switch 15, in comparison with the timing signal sent to optical switch drive circuit 16, is sent to optical pulse generating circuit 12. As a result, the sample optical pulse produced by the optical pulse generating circuit 12 is synchronized with the ON and OFF operation of optical switch 15 and it thus becomes possible to conduct output of an optical pulse having no unnecessary light which does not contribute to the sampling on the time axis.

In the present embodiment, the delay period correcting circuit 17 was provided within the timing circuit 11; however, this delay period correcting circuit 17 may be provided between the timing circuit 11 and the optical pulse generating circuit 12, and may have as the input signal thereof the timing signal generated by timing circuit 11, and may delay this inputted signal by an amount corresponding to the delay period of the operation of optical switch 15 to produce a timing signal, and may supply this timing signal to the optical pulse generating circuit 12.

Furthermore, a memory may be provided within the delay period correcting circuit 17 in order to set the delay period so that the corrected delay period may be regulated.

In the two embodiments described above, even if the optical filter 15 shown in FIGS. 1 and 4 is not present, it is possible to remove unnecessary light which does not contribute to the sampling along the time axis by means of optical switch 15, and it is thus possible to increase the measurement accuracy of the electro-optic sampling oscilloscope.

Furthermore, in the two embodiments described above, even if the optical switch 15 and the optical switch drive circuit 16 shown in FIGS. 1 and 4 are not present, it is possible to remove unnecessary light which does not contribute to the sampling in the spectra by means of optical filter 15, and it is thus possible to increase the measurement accuracy of the electro-optic sampling oscilloscope.

Additionally, in the two embodiments described above, the optical switch 14 shown in FIGS. 1 and 4 was provided between optical amplifier circuit 13 and optical switch 15; however, even if this is provided after optical switch 15, and the light outputted from optical switch 15 is inputted into optical filter 14, it is possible to achieve the same effects.

As described above, the following effects are achieved by using an electro-optic sampling oscilloscope in accordance with the present invention.

In accordance with the invention described in the first embodiment, an optical pulse output circuit which outputs an optical pulse for the purposes of observing the waveform of a signal to be measured is provided, and the optical pulse output circuit has as the input light thereof a sample optical pulse amplified by an optical amplifier circuit, and outputs, as an optical pulse, the output from an optical filter which blocks the propagation of the spontaneously emitted light of the optical amplifier circuit. By means of this, it is possible to reduce the unnecessary light which does not contribute to the sampling in the spectra, and as a result, it is possible to produce an electro-optic sampling oscilloscope which is capable of increasing the accuracy of measurement.

Furthermore, in accordance with the invention described in the first embodiment, the optical pulse output circuit is provided with: a timing circuit which generates a timing signal which serves as the optical pulse generation timing, an optical pulse generating circuit which conducts the generation of a sample optical pulse on the basis of the timing signal of the timing circuit, an optical amplifier circuit which conducts the optical amplification of the sample optical pulse generated by the optical pulse generating circuit, and an optical filter which blocks the propagation of the spontaneously emitted light amplified by the optical amplifier circuit. By means of this, it is possible to reduce the unnecessary light which does not contribute to the sampling in the spectra, and it is possible to produce an electro-optic sampling oscilloscope which is capable of increasing the measurement accuracy.

Next, in accordance with the invention described in the first embodiment, an optical pulse output circuit which outputs an optical pulse for the purposes of observing the waveform of a signal to be measured is provided, and the optical pulse output circuit controls the ON and OFF state of the sample optical pulse which was amplified by the optical amplifier circuit, and conducts the output of the optical pulse, using an optical switch synchronized with the sample optical pulse, by causing the optical switch to conduct light when the sample optical pulse is being generated, and cutting off the optical switch when the sample optical pulse is not being generated. By means of this, it is possible to reduce the unnecessary light which does not contribute to the spectrum along the time axis, and it is possible to produce an electro-optic sampling oscilloscope which is capable of increasing the measurement accuracy.

Furthermore, in accordance with the invention described in the first embodiment, the optical pulse output circuit is provided with: a timing circuit which generates a timing signal serving as the optical pulse generating timing, an optical pulse generating circuit, which conducts the generation of the sample optical pulse based on the timing signal from the timing circuit, an optical amplifier circuit, which conducts the optical amplification of the sample optical pulse generated by the optical pulse generating circuit, an optical switch which conducts the ON and OFF state of the light amplified by the optical amplifier circuit, and an optical switch drive circuit, which conducts the drive and control of the ON and OFF state of the optical switch based on the timing signal of the timing circuit. By means of this, it is possible to reduce the unnecessary light which does not contribute to the sampling along the time axis, and as a result, it is possible to produce an electro-optic sampling oscilloscope which increases the measurement accuracy.

Next, in accordance with the invention described in the first embodiment, an optical pulse output circuit is provided which outputs an optical pulse for the purposes of observing the waveform of a signal to be measured, and the optical pulse output circuit is provided with an optical filter which serves to block the propagation of spontaneously emitted light with respect to a sample optical pulse amplified by an optical amplifier circuit, and the optical pulse output circuit controls the ON and OFF state of the sample optical pulse amplified by the optical amplifier circuit, using an optical switch synchronized with the sample optical pulse, by causing the optical switch to transmit light when the sample optical pulse is being generated, and cutting off the optical switch when the sample optical pulse is not being generated, and the amplified sample optical pulse is passed through the optical filter and the optical switch, and is outputted as an optical pulse. By means of this, it is possible to reduce the unnecessary light which does not contribute to the sampling in the spectra, and to reduce the unnecessary light which does not contribute to the sampling along the time axis, and as a result, it is possible to produce an electro-optic sampling oscilloscope which is capable of increasing the measurement accuracy.

Furthermore, in accordance with the invention described in tht first embodiment, the optical pulse output circuit is provided with: a timing circuit which generates a timing signal which serves as the optical pulse generating timing, an optical pulse generating circuit which conducts the generation of the sample optical pulse on the basis of the timing signal from the timing circuit, an optical amplifier circuit, which conducts the optical amplification of the sample optical pulse generated by the optical pulse generating circuit, an optical switch, which controls the ON and OFF state of the light amplified by the optical amplifier circuit, an optical switch drive circuit, which conducts the drive and control of the ON and OFF state of the optical switch based on the timing signal of the timing circuit, and an optical filter, which is provided between the optical amplifier circuit and the optical switch, or after the optical switch, and which blocks the propagation of spontaneously emitted light amplified by the optical amplifier circuit. By means of this, it is possible to reduce the unnecessary light which does not contribute to the sampling in the spectra, and to reduce the unnecessary light which does not contribute to the sampling along the time axis, and as a result, it is possible to produce an electro-optic sampling oscilloscope which is capable of increasing the measurement accuracy.

Furthermore, in accordance with the invention described in the second embodiment, the timing circuit is provided with a delay period correcting circuit which generates a timing signal in which the timing signal is delayed by an amount corresponding to the delay period of the operation of the optical switch, and the timing signal generated by this delay period correcting circuit is supplied to the optical pulse generating circuit. By means of this, it is possible to correct the delay in the operation of the optical switch, to synchronize the sample optical pulse of the optical pulse generating circuit with the ON and OFF operation of the optical switch, and it is thus possible to output an optical pulse which has no unnecessary light which does not contribute to the sampling along the time axis.

Furthermore, in accordance with the invention described in the second embodiment, the optical pulse output circuit is provided with a delay period correcting circuit, provided between the timing circuit and the optical pulse generating circuit, and the delay period correcting circuit employs as the input signal thereof the timing signal generated by the timing circuit, and delays this input signal by an amount corresponding to the delay period of the operation of the optical switch, and generates a timing signal, and supplies this timing signal to the optical pulse generating circuit. By means of this, it is possible to correct the delay in the operation of the optical switch, and to synchronize the sample optical pulse of the optical pulse generating circuit with the ON and OFF operation of the optical switch, and it is thus possible to output an optical pulse which has no unnecessary light which does not contribute to the sampling along the time axis.

Furthermore, in accordance with the invention described in the first and second embodiments, the timing circuit employs a trigger signal as the input signal, and generates the timing signal based on this trigger signal. By means of this, in addition to the above effects, synchronization is facilitated in the processing circuit which conducts the processing of the measurement signal.

What is claimed is:

1. An electro-optic sampling oscilloscope, in which an electric field generated by a signal to be measured is coupled with an electro-optic crystal, an optical pulse outputted from an optical pulse output circuit is caused to enter into the electro-optic crystal, and the waveform of the signal to be measured is observed using the polarization state of the optical pulse, wherein:

the optical pulse output circuit controls the ON and OFF state of the sample optical pulse which was amplified by the optical amplifier circuit, and conducts the output of the optical pulse, using an optical switch synchronized with the sample optical pulse, by causing the optical switch to conduct light when the sample optical pulse is being generated, and cutting off the optical switch when the sample optical pulse is not being generated.

2. An electro-optic sampling oscilloscope according to claim 1, wherein the optical pulse output circuit comprises:

a timing circuit which generates a timing signal serving as the optical pulse generating timing;

an optical pulse generating circuit which conducts the generation of the sample optical pulse based on the timing signal from the timing circuit;

an optical amplifier circuit which conducts the optical amplification of the sample optical pulse generated by the optical pulse generating circuit;

an optical switch which conducts the ON and OFF state of the light amplified by the optical amplifier circuit; and an optical switch drive circuit which conducts the drive and control of the ON and OFF state of the optical switch based on the timing signal of the timing circuit.

3. An electro-optic sampling oscilloscope in which an optical field generated by a signal to be measured is coupled with an electro-optic crystal, and an optical pulse outputted from an optical pulse output circuit is caused to enter the electro-optic crystal, and in which, based on the polarization state of the optical pulse, the waveform of the signal to be measured is observed, wherein the optical pulse output circuit is provided with:

an optical filter which serves to block the propagation of spontaneously emitted light with respect to a sample optical pulse amplified by an optical amplifier circuit; and an optical switch which is synchronized with the sample optical pulse, and which conducts the ON and OFF state of the sample optical pulse amplified by the optical amplifier circuit by transmitting light when the sample optical pulse is being generated, and cutting off light when the sample optical pulse is not being generated; and wherein the optical pulse output circuit outputs the amplified sample optical pulse, which is passed through the optical filter and the optical switch, as an optical pulse.

4. An electro-optic sampling oscilloscope according to claim 3, wherein the optical pulse output circuit comprises:

a timing circuit which generates a timing signal which serves as the optical pulse generating timing;

an optical pulse generating circuit which conducts the generation of the sample optical pulse on the basis of the timing signal from the timing circuit;

an optical amplifier circuit which conducts the optical amplification of the sample optical pulse generated by the optical pulse generating circuit;

an optical switch which controls the ON and OFF state of the light amplified by the optical amplifier circuit;

an optical switch drive circuit which conducts the drive and control of the ON and OFF state of the optical switch based on the timing signal of the timing circuit; and an optical filter which is provided between the optical amplifier circuit and the optical switch, and blocks the propagation of spontaneously emitted light amplified by the optical amplifier circuit.

5. An electro-optic sampling oscilloscope according to claim 3, wherein the optical pulse output circuit comprises:
   a timing circuit which generates a timing signal which serves as the optical pulse generating timing;
   an optical pulse generating circuit which conducts the generation of the sample optical pulse on the basis of the timing signal from the timing circuit;
   an optical amplifier circuit which conducts the optical amplification of the sample optical pulse generated by the optical pulse generating circuit;
   an optical switch which controls the ON and OFF state of the light amplified by the optical amplifier circuit;
   an optical switch drive circuit which conducts the drive and control of the ON and OFF state of the optical switch based on the timing signal of the timing circuit; and
   an optical filter which is provided after the optical switch, and blocks the propagation of spontaneously emitted light amplified by the optical amplifier circuit.

6. An electro-optic sampling oscilloscope according to claim 2, wherein the timing circuit is provided with a delay period correcting circuit which generates a timing signal in which the timing signal is delayed by an amount corresponding to the delay period of the operation of the optical switch, and wherein
   the timing circuit supplies the timing signal generated by the delay period correcting circuit to the optical pulse generating circuit.

7. An electro-optic sampling oscilloscope according to claim 4, wherein the timing circuit is provided with a delay period correcting circuit which generates a timing signal in which the timing signal is delayed by an amount corresponding to the delay period of the operation of the optical switch, and wherein
   the timing circuit supplies the timing signal generated by the delay period correcting circuit to the optical pulse generating circuit.

8. An electro-optic sampling oscilloscope according to claim 5, wherein the timing circuit is provided with a delay period correcting circuit which generates a timing signal in which the timing signal is delayed by an amount corresponding to the delay period of the operation of the optical switch, and wherein
   the timing circuit supplies the timing signal generated by the delay period correcting circuit to the optical pulse generating circuit.

9. An electro-optic sampling oscilloscope according to claim 2, wherein:
   the optical pulse output circuit is further provided with a delay period correcting circuit which is provided between the timing circuit and the optical pulse generating circuit, and wherein
   the delay period correcting circuit employs as the input signal thereof the timing signal generated by the timing circuit, and delays this input signal by an amount corresponding to the delay period of the operation of the optical switch, and generates a timing signal, and supplies this timing signal to the optical pulse generating circuit.

10. An electro-optic sampling oscilloscope according to claim 4, wherein:
    the optical pulse output circuit is further provided with a delay period correcting circuit which is provided between the timing circuit and the optical pulse generating circuit, and wherein
    the delay period correcting circuit employs as the input signal thereof the timing signal generated by the timing circuit, and delays this input signal by an amount corresponding to the delay period of the operation of the optical switch, and generates a timing signal, and supplies this timing signal to the optical pulse generating circuit.

11. An electro-optic sampling oscilloscope according to claim 5, wherein:
    the optical pulse output circuit is further provided with a delay period correcting circuit which is provided between the timing circuit and the optical pulse generating circuit, and wherein
    the delay period correcting circuit employs as the input signal thereof the timing signal generated by the timing circuit, and delays this input signal by an amount corresponding to the delay period of the operation of the optical switch, and generates a timing signal, and supplies this timing signal to the optical pulse generating circuit.

12. An electro-optic sampling oscilloscope according to claim 2, wherein the timing circuit employs a trigger signal as an input signal, and generates a timing signal based on this trigger signal.

13. An electro-optic sampling oscilloscope according to claim 4, wherein the timing circuit employs a trigger signal as an input signal, an generates a timing signal based on this trigger signal.

14. An electro-optic sampling oscilloscope according to claim 5, wherein the timing circuit employs a trigger signal as an input signal, and generates a timing signal based on this trigger signal.

15. An electro-optic sampling oscilloscope according to claim 6, wherein the timing circuit employs a trigger signal as an input signal, and generates a timing signal based on this trigger signal.

16. An electro-optic sampling oscilloscope according to claim 7, wherein the timing circuit employs a trigger signal as an input signal, and generates a timing signal based on this trigger signal.

17. An electro-optic sampling oscilloscope according to claim 9, wherein the timing circuit employs a trigger signal as an input signal, and generates a timing signal based on this trigger signal.

* * * * *